US012588413B2

(12) United States Patent
Lee

(10) Patent No.: US 12,588,413 B2
(45) Date of Patent: Mar. 24, 2026

(54) THERMOELECTRIC DEVICE

(71) Applicant: LG INNOTEK CO., LTD., Seoul (KR)

(72) Inventor: Un Hak Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 139 days.

(21) Appl. No.: 18/572,365

(22) PCT Filed: Jun. 22, 2022

(86) PCT No.: PCT/KR2022/008887
§ 371 (c)(1),
(2) Date: Dec. 20, 2023

(87) PCT Pub. No.: WO2022/270912
PCT Pub. Date: Dec. 29, 2022

(65) Prior Publication Data
US 2024/0284800 A1 Aug. 22, 2024

(30) Foreign Application Priority Data
Jun. 22, 2021 (KR) ........................ 10-2021-0080901

(51) Int. Cl.
*H10N 19/00* (2023.01)
*H10N 10/13* (2023.01)
(Continued)

(52) U.S. Cl.
CPC ........... *H10N 19/101* (2023.02); *H10N 10/13* (2023.02); *H10N 10/17* (2023.02); *H10N 10/82* (2023.02)

(58) Field of Classification Search
None
See application file for complete search history.

(56) References Cited

U.S. PATENT DOCUMENTS

2012/0298163 A1* 11/2012 Brehm ................... H10N 10/13
136/210
2016/0126438 A1* 5/2016 Marc ...................... H10N 10/17
136/203

FOREIGN PATENT DOCUMENTS

CN 106595354 8/2018
EP 3723146 10/2020
(Continued)

OTHER PUBLICATIONS

International Search Report dated Sep. 22, 2022 issued in Application No. PCT/KR2022/008887.
(Continued)

*Primary Examiner* — Tamir Ayad
(74) *Attorney, Agent, or Firm* — KED & ASSOCIATES, LLP

(57) ABSTRACT
A thermoelectric device according to an embodiment of the present invention comprises: a fluid flow part including one surface and the other surface spaced apart from the one surface in a first direction; a first thermoelectric element arranged on one surface of the fluid flow part; and a second thermoelectric element arranged on the other surface of the fluid flow part, wherein a first through-hole penetrating from the one surface to the other surface thereof is arranged in the fluid flow part, and a wire electrically connected to the first thermoelectric element is electrically connected to the second thermoelectric element through the first through-hole.

13 Claims, 13 Drawing Sheets

(51) Int. Cl.
  *H10N 10/17*      (2023.01)
  *H10N 10/82*      (2023.01)

(56)           References Cited

FOREIGN PATENT DOCUMENTS

| KR | 10-2016-0008858 | 1/2016 |
|----|-----------------|--------|
| KR | 10-2019-0097380 | 8/2019 |
| KR | 10-2020-0109891 | 9/2020 |
| KR | 10-2021-0069432 | 6/2021 |

OTHER PUBLICATIONS

Extended European Search Report dated May 19, 2025, issued in Application No. 22828759.5.

\* cited by examiner

first direction   second direction third direction

THERMOELECTRIC DEVICE

CROSS-REFERENCE TO RELATED PATENT APPLICATIONS

This application is a U.S. National Stage Application under 35 U.S.C. § 371 of PCT Application No. PCT/KR2022/008887, filed Jun. 22, 2022, which claims priority to Korean Patent Application No. 10-2021-0080901, filed Jun. 22, 2021, whose entire disclosures are hereby incorporated by reference.

TECHNICAL FIELD

The present invention relates to a thermoelectric device, and more specifically, to a thermoelectric device using a temperature difference between a low-temperature part and a high-temperature part of the thermoelectric element.

BACKGROUND ART

A thermoelectric phenomenon is a phenomenon caused by the movement of electrons and holes inside a material and means direct energy conversion between heat and electricity.

A thermoelectric element is a general term for an element using the thermoelectric phenomenon and has a structure in which a P-type thermoelectric material and an N-type thermoelectric material are bonded between metal electrodes to form a pair of a PN junction.

Thermoelectric elements may be classified into elements using a temperature change in electrical resistance, elements using the Seebeck effect, which is a phenomenon in which an electromotive force is generated due to a temperature difference, elements using the Peltier effect, which is a phenomenon in which heat absorption or heat generation occurs due to a current, and the like.

Thermoelectric elements are widely applied to home appliances, electronic components, communication components, and the like. For example, the thermoelectric elements may be applied to cooling devices, heating devices, power generation devices, and the like. Therefore, the demand for the thermoelectric performance of the thermoelectric element is gradually increasing.

Recently, there is a need to generate electricity using high-temperature waste heat generated from engines of vehicles, vessels, and the like and the thermoelectric element. In this case, a fluid flow part through which a first fluid passes may be disposed at a low-temperature part side of the thermoelectric element, a heatsink may be disposed at a high-temperature part side of the thermoelectric element, and a second fluid with a higher temperature than the first fluid may pass through the heat sink. Therefore, electricity may be generated by a temperature difference between a low-temperature part and a high-temperature part of the thermoelectric element.

DISCLOSURE

Technical Problem

The present invention is directed to providing a thermoelectric device using a temperature difference between a low-temperature part and a high-temperature part of a thermoelectric element.

Technical Solution

One aspect of the present invention provides a thermoelectric device according to an embodiment of the present invention including a fluid flow part including one surface and the other surface spaced apart from the one surface in a first direction, a first thermoelectric element disposed on the one surface of the fluid flow part, and a second thermoelectric element disposed on the other surface of the fluid flow part, wherein a first through hole passing through the fluid flow part from the one surface to the other surface is disposed in the fluid flow part, and a wire electrically connected to the first thermoelectric element passes through the first through hole and is electrically connected to the second thermoelectric element.

The thermoelectric device may further include a first guide member disposed on a side surface of the first thermoelectric element on the one surface of the fluid flow part, and a second guide member disposed on a side surface of the second thermoelectric element on the other surface of the fluid flow part, wherein a second through hole overlapping the first through hole in the first direction may be disposed in the first guide member.

An area of the second through hole may be greater than an area of the first through hole.

A wire connected to at least one of the first thermoelectric element and the second thermoelectric element may be guided by at least one of the first guide member and the second guide member.

A plurality of holes passing through the fluid flow part from the one surface to the other surface and not overlapping the first thermoelectric element and the second thermoelectric element in the first direction may be disposed in the fluid flow part, at least one first coupling hole may be disposed in the first guide member, at least one second coupling hole may be disposed in the second guide member, the first guide member and the fluid flow part may be fixed by coupling members disposed in the at least one first coupling hole and some of the plurality of holes, and the second guide member and the fluid flow part may be fixed by coupling members disposed in the at least one second coupling hole and some of the other holes of the plurality of holes.

The at least one first coupling hole and the at least one second coupling hole may be disposed not to overlap each other in the first direction.

A fluid inlet of the fluid flow part may be disposed in one side surface between the one surface and the other surface, a fluid outlet of the fluid flow part may be disposed in the other side surface facing the one side surface between the one surface and the other surface, the fluid flow part may include a flow path extending in a second direction from the one side surface to the other side surface, and a plurality of insulating members spaced apart from each other in the second direction may be disposed on an upper surface between the one surface and the other surface.

The upper surface may include a plurality of holes disposed between the plurality of insulating members, a shield member may be disposed on the plurality of insulating members, and the shield member and the upper surface may be fixed by coupling members disposed in the shield member and the plurality of holes.

The one surface may further include a plurality of holes disposed to be spaced apart from each other in the second direction between the first thermoelectric element and the upper surface, and the plurality of holes included in the upper surface and the plurality of holes included in the one surface may be disposed in the second direction to be misaligned with each other.

The first thermoelectric element may include a first substrate disposed on the one surface of the fluid flow part, a first electrode disposed on a first area of the first substrate, a semiconductor structure disposed on the first electrode, a second electrode disposed on the semiconductor structure, and a second substrate disposed on the second electrode, the thermoelectric device may further include a connector part disposed on a second area adjacent to the first area of the first substrate and electrically connected to the first electrode, and a support member disposed adjacent to the connector part on the second area, and a height of the support member may be greater than a height of the connector part with respect to the first substrate.

A wire connected to the connector part may extend to the first guide member in the second direction through the support member.

The support member may include a first protruding surface protruding in a direction perpendicular to the first substrate and disposed to extend in the second direction, and a second protruding surface spaced apart from the first protruding surface in a direction away from the connector part, protruding in a direction perpendicular to the first substrate, and disposed to extend in the second direction, and at least one of the first protruding surface and the second protruding surface may include a bending area bent in a direction parallel to the first substrate.

A shortest distance between the first protruding surface and the second protruding surface may be smaller than a diameter of the wire.

Advantageous Effects

According to an embodiment of the present invention, it is possible to obtain a thermoelectric device that can have a simple structure, can be easy to assemble, and can accommodate the maximum number of thermoelectric elements in a predetermined space.

According to the embodiment of the present invention, it is possible to obtain a thermoelectric device with high thermoelectric performance by increasing a temperature difference between a high-temperature part and a low-temperature part.

The thermoelectric device according to the embodiment of the present invention may be applied to power generation devices for generating electricity using the temperature difference between the high-temperature part and the low-temperature part.

The thermoelectric device according to an embodiment of the present invention may be applied to a Peltier device for cooling or heating a specific object such as a fluid.

DESCRIPTION OF DRAWINGS

FIG. 1 is a perspective view of a thermoelectric device according to one embodiment of the present invention.

MODES OF THE INVENTION

Hereinafter, exemplary embodiments according to the present invention will be described in detail with reference to the accompanying drawings.

However, the technical spirit of the present disclosure is not limited to some of the described embodiments, but may be implemented in various different forms, and one or more of the components among the embodiments may be used by being selectively coupled or substituted without departing from the scope of the technical spirit of the present disclosure.

In addition, the terms (including technical and scientific terms) used in embodiments of the present invention may be construed as meaning that may be generally understood by those skilled in the art to which the present invention pertains unless explicitly specifically defined and described, and the meanings of the commonly used terms, such as terms defined in a dictionary, may be construed in consideration of contextual meanings of related technologies.

In addition, the terms used in the embodiments of the present invention are for describing the embodiments and are not intended to limit the present invention.

In the specification, a singular form may include a plural form unless otherwise specified in the phrase, and when described as "at least one (or one or more) of A, B, and C," one or more among all possible combinations of A, B, and C may be included.

In addition, terms such as first, second, A, B, (a), and (b) may be used to describe components of the embodiments of the present disclosure.

These terms are only for the purpose of distinguishing one component from another component, and the nature, sequence, order, or the like of the corresponding components is not limited by these terms.

In addition, when a first component is described as being "connected," "coupled," or "joined" to a second component, it may include a case in which the first component is directly connected, coupled, or joined to the second component, but also a case in which the first component is "connected," "coupled," or "joined" to the second component by other components present between the first component and the second component.

In addition, when a certain component is described as being formed or disposed on "on (above)" or "below (under)" another component, the terms "on (above)" or "below (under)" may include not only a case in which two components are in direct contact with each other, but also a case in which one or more other components are formed or disposed between the two components. In addition, when described as "on (above) or below (under)," it may include the meaning of not only an upward direction but also a downward direction based on one component.

Figure 1:
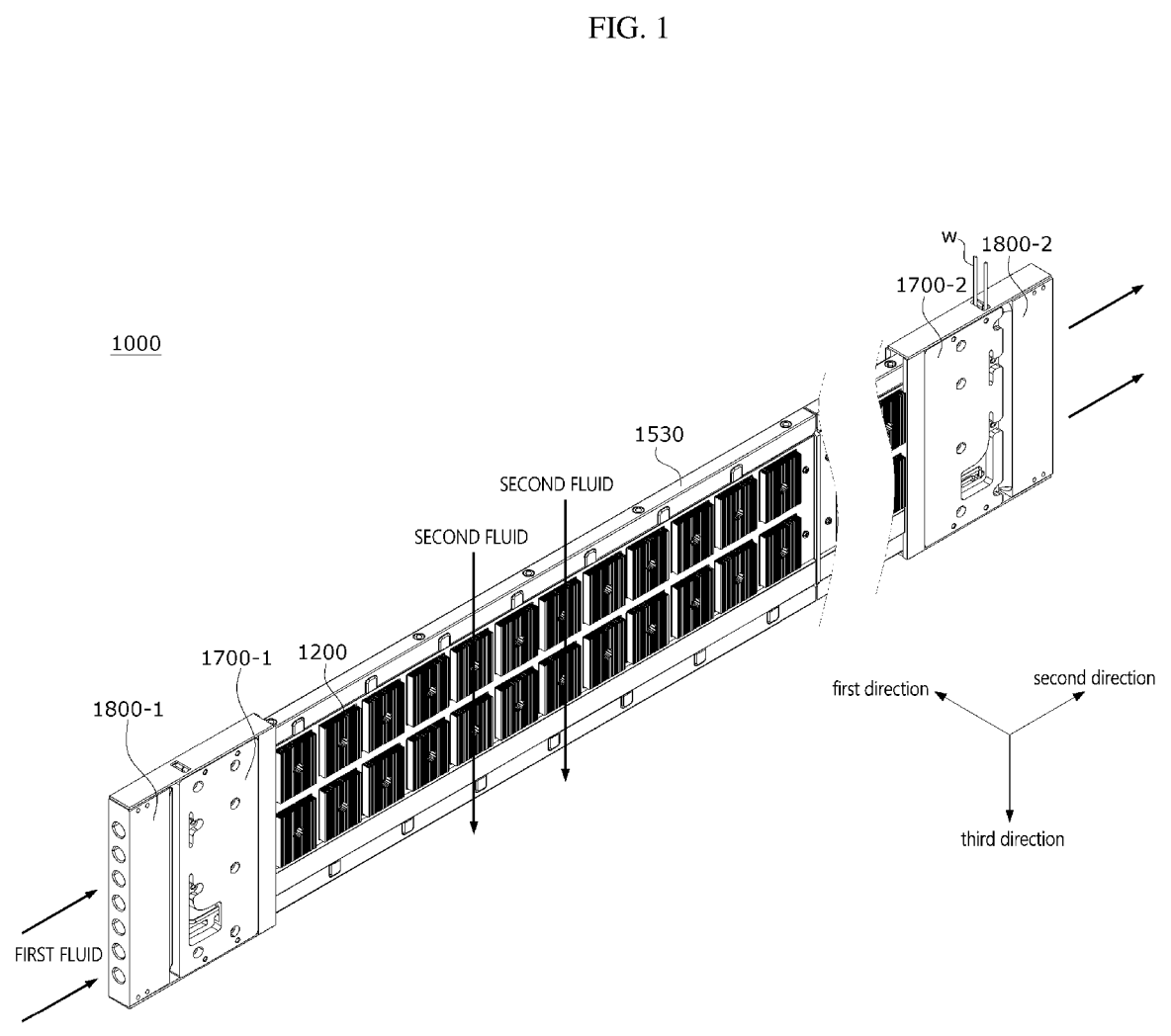
Figure 2:
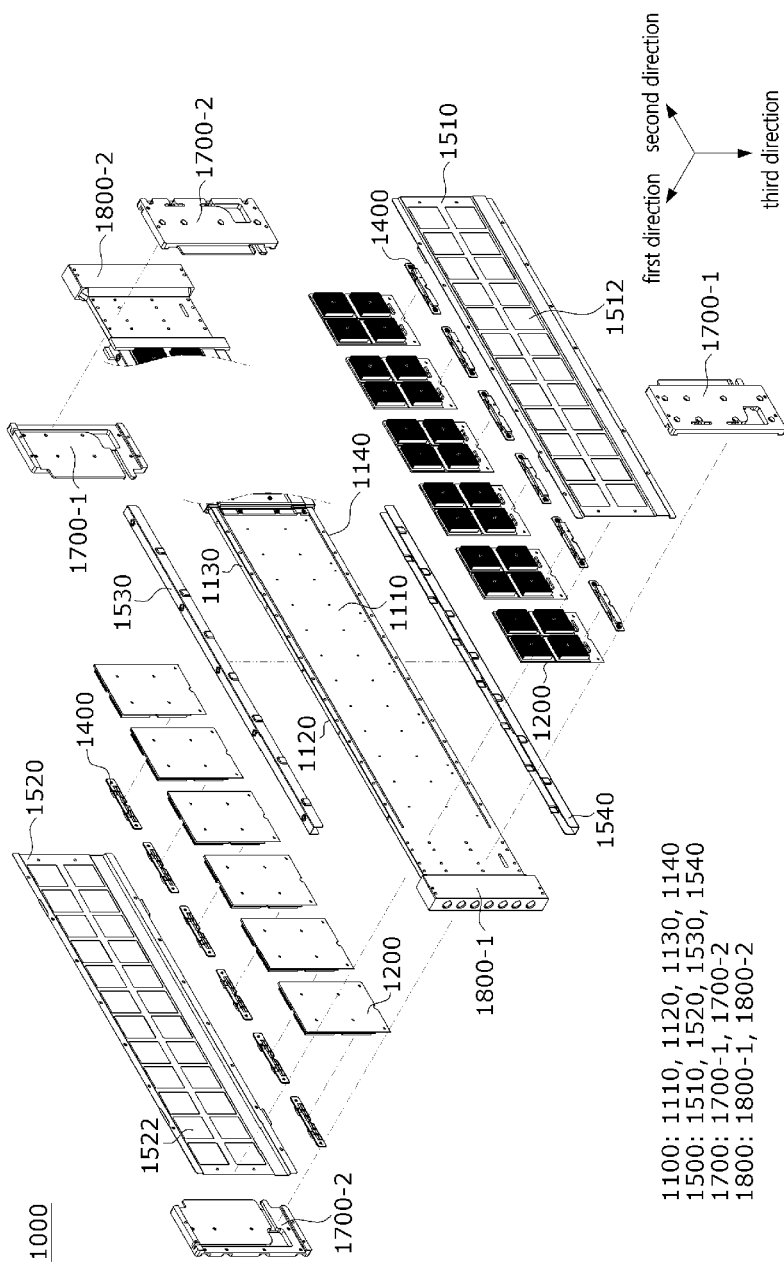
FIG. 2 is an exploded perspective view of the thermoelectric device according to one embodiment of the present invention.

FIG. 1 is a perspective view of a thermoelectric device according to one embodiment of the present invention, and FIG. 2 is an exploded perspective view of the thermoelectric device according to one embodiment of the present invention.

Referring to FIGS. 1 and 2, a thermoelectric device 1000 includes a fluid flow part 1100 and a thermoelectric module 1200 disposed on a surface of the fluid flow part 1100.

The thermoelectric device 1000 according to the embodiment of the present invention may generate power using a temperature difference between a first fluid flowing inside the fluid flow part 1100 and a second fluid flowing outside the fluid flow part 1100. A plurality of thermoelectric devices 1000 may be disposed in parallel to be spaced predetermined distances from each other to form a power generation system.

The first fluid flowing into the fluid flow part 1100 may be water, but is not limited thereto and may be various types of fluids with cooling performance. A temperature of the first fluid flowing into the fluid flow part 1100 may be lower than 100° C. preferably, lower than 50° C. and more preferably, lower than 40° C. but is not limited thereto and may be a fluid with a lower temperature than the second fluid. A temperature of the first fluid discharged after passing through the fluid flow part 1100 may be higher than the temperature of the first fluid flowing into the fluid flow part 1100.

According to the embodiment of the present invention, a plurality of thermoelectric modules 1200 may be disposed on a first surface 1110 and a second surface 1120 facing the first surface 1110 of the fluid flow part 1100. The first fluid may flow from one side surface between the first surface 1110 and the second surface 1120 toward the other side surface facing the one side surface between the first surface 1110 and the second surface 1120. To this end, a fluid inlet may be disposed in the one side surface, and a fluid outlet may be disposed in the other side surface. The second fluid may flow from a third surface 1130, which is an upper surface between the first surface 1110 and the second surface 1120, toward a fourth surface 1140, which is a lower surface between the first surface 1110 and the second surface 1120. For convenience of description, in the specification, a direction from the first surface 1110 to the second surface 1120 may be referred to as a first direction, a direction in which the first fluid flows may be referred to as a second direction, and a direction in which the second fluid flows may be referred to as a third direction, but the present invention is not limited thereto.

In order to facilitate the introduction and discharge of the first fluid and support the fluid flow part 1100, a first connecting member 1800-1 and a second connecting member 1800-2 may be installed at the fluid inlet side and the fluid outlet side of the fluid flow part 1100, respectively. In the specification, the first connecting member 1800-1 and the second connecting member 1800-2 may be used interchangeably with the first tube expanding member 1800-1 and the second tube expanding member 1800-2, respectively. Alternatively, in the specification, the first connecting member 1800-1 and the second connecting member 1800-2 may be used interchangeably with the first tube expanding block 1800-1 and the second tube expanding block 1800-2, respectively.

Meanwhile, the second fluid passes through the outside of the thermoelectric module 1200, for example, a heat sink disposed outside the fluid flow part 1100. The second fluid may be waste heat generated from engines of vehicles, vessels, and the like, but is not limited thereto. For example, a temperature of the second fluid may be 100° C. or higher, preferably, 200° C. or higher, and more preferably, 220 to 250° C. but is not limited thereto and may be a fluid with a higher temperature than the first fluid.

In the specification, an example in which a temperature of the first fluid flowing through the inside of the fluid flow part 1100 is lower than the temperature of the second fluid passing through the heat sink of the thermoelectric module 1200 disposed outside the fluid flow part 1100 will be described. Therefore, in the specification, the fluid flow part 1100 may be referred to as a duct or a cooling part. However, the embodiment of the present invention is not limited thereto, and the temperature of the first fluid flowing through the inside of the fluid flow part 1100 may be higher than the temperature of the second fluid passing through the heat sink of the thermoelectric module 1200 disposed outside the fluid flow part 1100.

According to the embodiment of the present invention, the thermoelectric module 1200 includes a thermoelectric element and the heat sink disposed on the thermoelectric element. The thermoelectric element according to the embodiment of the present invention may have a structure of a thermoelectric element 100 illustrated in FIGS. 3 and 4.

Figure 3:
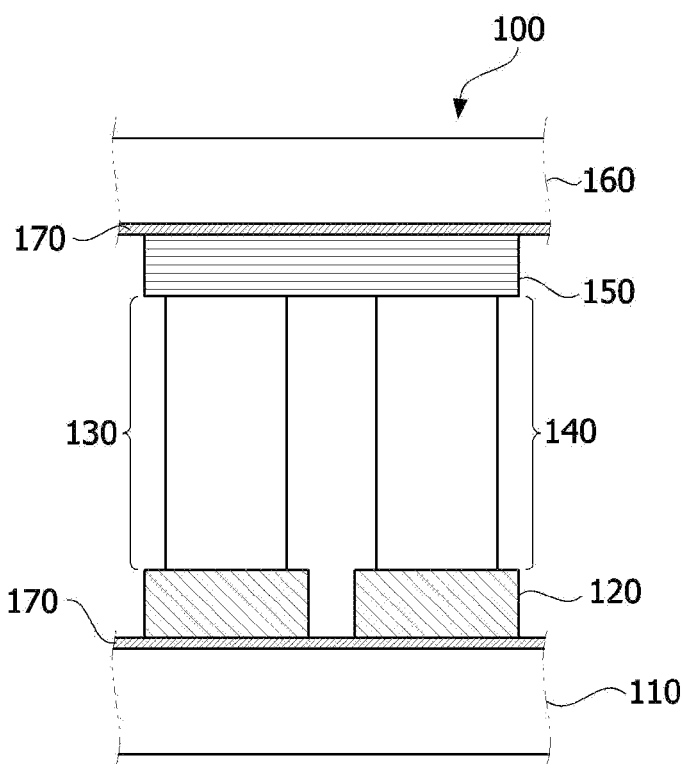
FIG. 3 is a cross-sectional view of a thermoelectric element according to one embodiment of the present invention.
Figure 4:
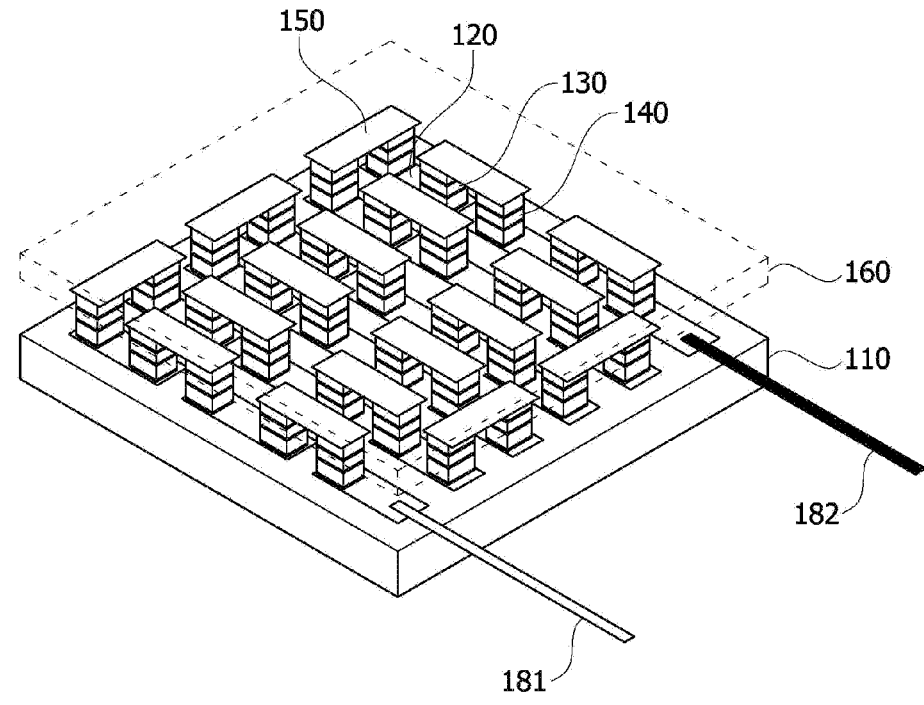
FIG. 4 is a perspective view of the thermoelectric element according to one embodiment of the present invention.

Referring to FIGS. 3 and 4, the thermoelectric element 100 includes a first substrate 110, a first electrode 120, a P-type thermoelectric leg 130, an N-type thermoelectric leg 140, a second electrode 150, and a second substrate 160.

The first electrode 120 is disposed between the first substrate 110 and lower bottom surfaces of the P-type thermoelectric leg 130 and the N-type thermoelectric leg 140, and the second electrode 150 is disposed between the second substrate 160 and upper bottom surfaces of the P-type thermoelectric leg 130 and the N-type thermoelectric leg 140. Therefore, the plurality of P-type thermoelectric legs 130 and the plurality of N-type thermoelectric legs 140 are electrically connected by the first electrodes 120 and the second electrodes 150. A pair of P-type thermoelectric legs 130 and N-type thermoelectric legs 140 disposed between the first electrode 120 and the second electrode 150 and electrically connected may form a unit cell.

For example, when a voltage is applied to the first electrode 120 and the second electrode 150 through lead wires 181 and 182, due to the Peltier effect, a substrate in which current flows from the P-type thermoelectric leg 130 to the N-type thermoelectric leg 140 may absorb heat to function as a cooling part, and a substrate in which current flows from the N-type thermoelectric leg 140 to the P-type thermoelectric leg 130 may be heated to function as a heating part. Alternatively, when the temperature difference between the first electrode 120 and the second electrode 150 is applied, charges in the P-type thermoelectric leg 130 and the N-type thermoelectric leg 140 may be moved due to the Seebeck effect to generate electricity.

Here, the P-type thermoelectric leg 130 and the N-type thermoelectric leg 140 may be bismuth telluride (Bi—Te)-based thermoelectric legs containing bismuth (Bi) and tellurium (Te) as main raw materials. The P-type thermoelectric leg 130 may be a bismuth telluride (Bi—Te)-based thermoelectric leg containing at least one of antimony (Sb), nickel (Ni), aluminum (Al), copper (Cu), silver (Ag), lead (Pb), boron (B), gallium (Ga), tellurium (Te), bismuth (Bi), and indium (In). For example, the P-type thermoelectric leg 130 may contain Bi—Sb—Te, which is the main raw material, at 99 to 99.999 wt % based on 100 wt % of the total weight and contain at least one of nickel (Ni), aluminum (Al), copper (Cu), silver (Ag), lead (Pb), boron (B), gallium (Ga), and indium (In) at 0.001 to 1 wt %. The N-type thermoelectric leg 140 may be a bismuth telluride (Bi—Te)-based thermoelectric leg containing at least one of antimony (Sb), nickel (Ni), aluminum (Al), copper (Cu), silver (Ag), lead (Pb), boron (B), gallium (Ga), tellurium (Te), bismuth (Bi), and indium (In). For example, the N-type thermoelectric leg 140 may contain Bi—Sb—Te, which is the main raw material, at 99 to 99.999 wt % based on 100 wt % of the total weight and contain at least one of nickel (Ni), aluminum (Al), copper (Cu), silver (Ag), lead (Pb), boron (B), gallium (Ga), and indium (In) at 0.001 to 1 wt %.

The P-type thermoelectric leg 130 and the N-type thermoelectric leg 140 may be formed in a bulk type or a stack type. In general, the bulk-type P-type thermoelectric leg 130 or the bulk-type N-type thermoelectric leg 140 may be obtained through a process of manufacturing an ingot through thermal treatment for a thermoelectric material, crushing and sieving the ingot to acquire powder for the thermoelectric leg, then sintering the powder, and cutting a sintered body. In this case, the P-type thermoelectric leg 130 and the N-type thermoelectric leg 140 may be polycrystalline thermoelectric legs. As described above, when the P-type thermoelectric leg 130 and the N-type thermoelectric leg 140 are the polycrystalline thermoelectric legs, strengths of the P-type thermoelectric leg 130 and the N-type thermoelectric leg 140 may be increased. The stack-type P-type thermoelectric leg 130 or the stack-type N-type thermoelectric leg 140 may be obtained through a process of coating a sheet-shaped base with a paste containing a thermoelectric material to form a unit member, and then stacking and cutting the unit members.

In this case, the pair of P-type thermoelectric legs 130 and N-type thermoelectric legs 140 may have the same shape and volume or have different shapes and volumes. For example, since the electrical conduction characteristics of the P-type thermoelectric leg 130 and the N-type thermoelectric leg 140 are different, a height or cross-sectional area of the N-type thermoelectric leg 140 may be formed differently from a height or cross-sectional area of the P-type thermoelectric leg 130.

In this case, the P-type thermoelectric leg 130 or the N-type thermoelectric leg 140 may have a cylindrical shape, a polygonal pillar shape, an oval pillar shape, or the like.

In the specification, the thermoelectric leg may be referred to as a thermoelectric structure, a semiconductor element, a semiconductor structure, or the like.

The performance of the thermoelectric element according to one embodiment of the present invention may be expressed as a thermoelectric figure of merit (ZT). The ZT can be expressed as in Equation 1.

$$ZT = \alpha^2 \cdot \sigma \cdot T / k \qquad \text{[Equation 1]}$$

Here, α denotes a Seebeck coefficient [V/K], σ denotes an electrical conductivity [S/m], and $\alpha^2\sigma$ denotes a power factor [W/mK²]. In addition, T denotes a temperature, and k denotes a thermal conductivity [W/mK]. k can be expressed as a·cp·ρ, in which a denotes a thermal diffusivity [cm²/S], cp denotes a specific heat [J/gK], and ρ denotes a density [g/cm³].

In order to obtain a thermoelectric performance index of the thermoelectric element, a Z value (V/K) may be measured using a Z meter, and the ZT may be calculated using the measured Z value.

Here, the first electrode 120 disposed between the first substrate 110 and the P-type thermoelectric leg 130 and the N-type thermoelectric leg 140, and the second electrode 150 disposed between the second substrate 160 and the P-type thermoelectric leg 130 and the N-type thermoelectric leg 140 may contain at least one of copper (Cu), silver (Ag), aluminum (Al), and nickel (Ni) and have a thickness of 0.01 to 0.3 mm. When a thickness of the first electrode 120 or the second electrode 150 is smaller than 0.01 mm, a function as an electrode may be degraded, thereby reducing the electrical conduction performance, and when the thickness exceeds 0.3 mm, the electrical conduction efficiency can be reduced due to an increase in resistance.

In addition, the first substrate 110 and the second substrate 160 facing each other may be metal substrates, and thicknesses thereof may be in a range of 0.1 to 1.5 mm. When the thickness of the metal substrate is smaller than 0.1 mm or more than 1.5 mm, the heat radiation characteristics or thermal conductivity may be excessively high, thereby reducing the reliability of the thermoelectric element. In addition, when the first substrate 110 and the second substrate 160 are metal substrates, an insulating layer 170 may be further formed between the first substrate 110 and the first electrode 120 and between the second substrate 160 and the second electrode 150. The insulating layer 170 may contain a material with a thermal conductivity of 1 to 20 W/mK. In this case, the insulating layer 170 may be a layer made of a resin composition containing at least one of an epoxy resin and silicone resin and an inorganic material or a silicone composite containing silicone and an inorganic material. Here, the inorganic material may be at least one of an oxide, a nitride, and a carbide such as aluminum, boron, and silicon.

In this case, the first substrate 110 and the second substrate 160 may be formed to have different sizes. In other words, a volume, thickness, or area of one of the first substrate 110 and the second substrate 160 may be formed to be greater than a volume, thickness, or area of the other one. Here, the thickness may be a thickness in a direction from the first substrate 110 to the second substrate 160, and the area may be an area in a direction perpendicular to a direction from the first substrate 110 to the second substrate 160. Therefore, it is possible to enhance the heat absorption or heat radiation performance of the thermoelectric element. Preferably, the volume, thickness, or area of the first substrate 110 may be formed to be greater than at least one of the volume, thickness, or area of the second substrate 160. In this case, when the first substrate 110 is disposed in a high-temperature area for the Seebeck effect, when the first substrate 110 is applied as a heating area for the Peltier effect, or when a sealing member for protecting the first substrate 110 from an external environment of the thermoelectric element, which will be described below, is disposed on the first substrate 110, at least one of the volume, the thickness, and the area of the first substrate may become greater than the second substrate 160. In this case, the area of the first substrate 110 may be in a range of 1.2 to 5 times the area of the second substrate 160. When the area of the first substrate 110 is formed to be smaller than 1.2 times that of the second substrate 160, the influence on improving thermal transfer efficiency is not high, and when the area of the first substrate 110 exceeds 5 times, the thermal transfer efficiency may be rather reduced significantly, thereby making it difficult to maintain a basic shape of the thermoelectric module.

In addition, a heat radiation pattern, for example, an uneven pattern may be formed on a surface of at least one of the first substrate 110 and the second substrate 160. Therefore, it is possible to enhance the heat radiation performance of the thermoelectric element. When the uneven pattern is formed on the surface in contact with the P-type thermoelectric leg 130 or the N-type thermoelectric leg 140, it is possible to improve the bonding characteristics between the thermoelectric leg and the substrate.

Although not illustrated, a sealing member may be further disposed between the first substrate 110 and the second substrate 160. The sealing member may be disposed on side surfaces of the first electrode 120, the P-type thermoelectric leg 130, the N-type thermoelectric leg 140, and the second electrode 150 between the first substrate 110 and the second substrate 160. Therefore, the first electrode 120, the P-type thermoelectric leg 130, the N-type thermoelectric leg 140, and the second electrode 150 may be shielded from external moisture, heat, contamination, and the like.

Referring back to FIGS. 1 and 2, the plurality of thermoelectric modules 1200 may be disposed on the first surface 1110 and the second surface 1120 of the fluid flow part 1100.

As described above, each thermoelectric element includes the first substrate 110 disposed in contact with the fluid flow part 1100, the plurality of first electrodes 120 disposed on the first substrate 110, the plurality of thermoelectric legs 130 and 140 disposed on the plurality of first electrodes 120, the plurality of second electrodes 150 disposed on the plurality of thermoelectric legs 130 and 140, and the plurality of second electrodes 150, and the heat sink is disposed on the second substrate 160. In this case, the first substrate of the thermoelectric element disposed on the fluid flow part 1100 may be a metal substrate, and the metal substrate may be attached to the surface of the fluid flow part 1100 by a thermal interface material (TIM) (not illustrated). Since the metal substrate has excellent thermal transfer performance, thermal transfer between the thermoelectric element and the fluid flow part 1100 is easy. In addition, when the metal substrate and the fluid flow part 1100 are bonded by the TIM, the thermal transfer between the metal substrate and the fluid flow part 1100 may not be hindered. Here, the metal substrate may be one of a copper substrate, an aluminum substrate, and a copper-aluminum substrate, but is not limited thereto.

Each of the plurality of thermoelectric modules 1200 may include a connector part for extracting generated electricity to the outside or applying the electricity to be used as a Peltier device. According to the embodiment of the present invention, a support member 1400 may be disposed around the connector part to uniformly maintain a bonding strength between the thermoelectric module 1200 and the fluid flow part 1100 and protect a wire connected to the connector part.

In addition, according to the embodiment of the present invention, a shield member 1500 may be further disposed to prevent moisture or contaminants from flowing into the plurality of thermoelectric modules 1200. The shield member 1500 may include a first shield member 1510 disposed on the first surface 1110 of the fluid flow part 1100 and a second shield member 1520 disposed on the second surface 1120 of the fluid flow part 1100. The first shield member 1510 and the second shield member 1520 may each be disposed on the second substrate of the thermoelectric element. In this case, in order for the second fluid to pass through the heat sink, through holes 1512 and 1522 may be formed in the first shield member 1510 and the second shield member 1520, respectively, and edges of the through holes 1512 and 1522 may be disposed in the second substrate of the thermoelectric element so that the heat sink may be exposed through the through holes 1512 and 1522. Therefore, it is possible to protect the inside of the thermoelectric element from external contaminants, moisture, and the second fluid and allow the second fluid to directly pass through the heat sink, thereby efficiently performing the heat exchange between the second fluid and the heat sink. According to one embodiment of the present invention, the shield member 1500 may further include a third shield member 1530 disposed on the third surface 1130 of the fluid flow part 1100 and a fourth shield member 1540 disposed at the fourth surface 1140 of the fluid flow part 1100. Since the second fluid may flow in a direction from the third surface 1130 to the fourth surface 1140 of the fluid flow part 1100, an insulating member may be further disposed between the third surface 1130 of the fluid flow part 1100 and the third shield member 1530 and between the fourth surface 1140 and the fourth shield member 1540. Therefore, since the first fluid flowing inside the fluid flow part 1100 and the second fluid flowing outside the fluid flow part 1100 are insulated, it is possible to enhance the thermoelectric performance of the thermoelectric element.

Meanwhile, according to the embodiment of the present invention, a guide member 1700 may be further disposed on the first surface 1110 and the second surface 1120 of the fluid flow part 1100. The guide member 1700 may function to guide the wire connected to the thermoelectric module 1200 to the outside. The guide member 1700 may be disposed on a side surface of the thermoelectric module 1200 on each of the first surface 1110 and the second surface 1120 of the fluid flow part 1100.

Figure 5:
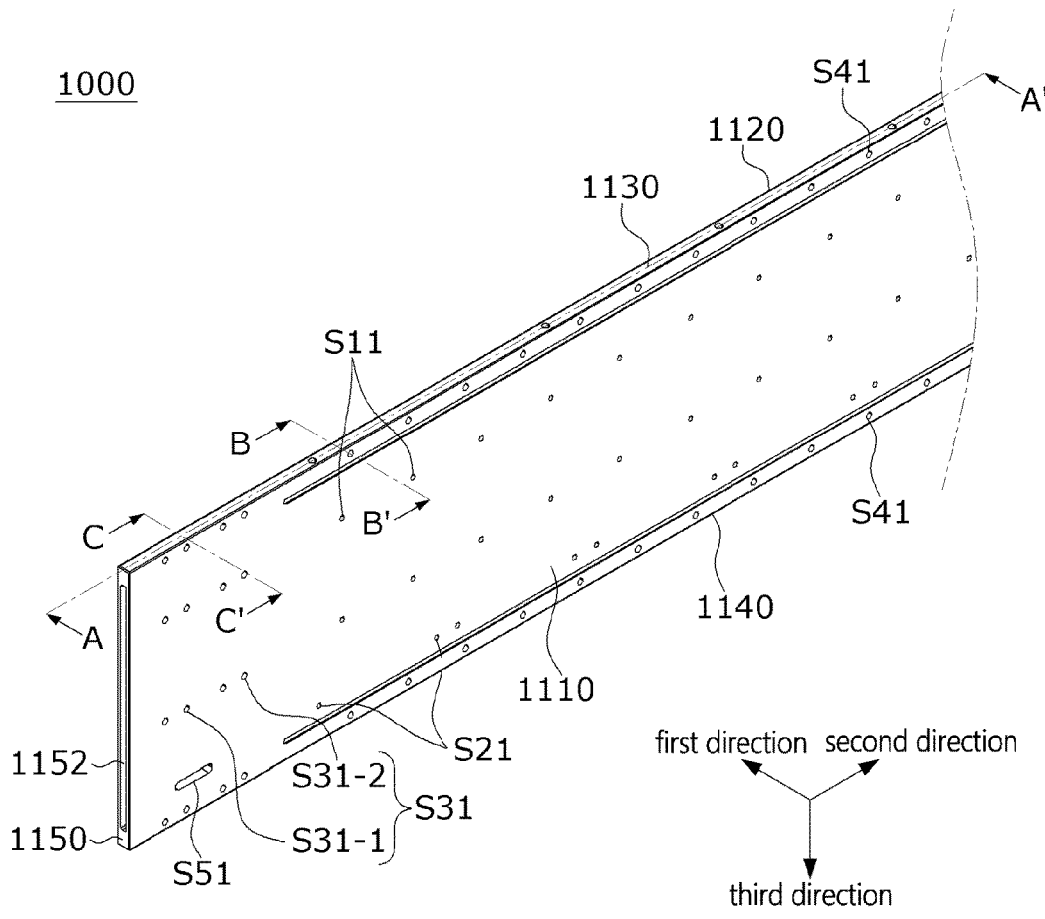
FIG. 5 is a perspective view of one surface of a fluid flow part included in the thermoelectric device according to one embodiment of the present invention.
Figure 6:
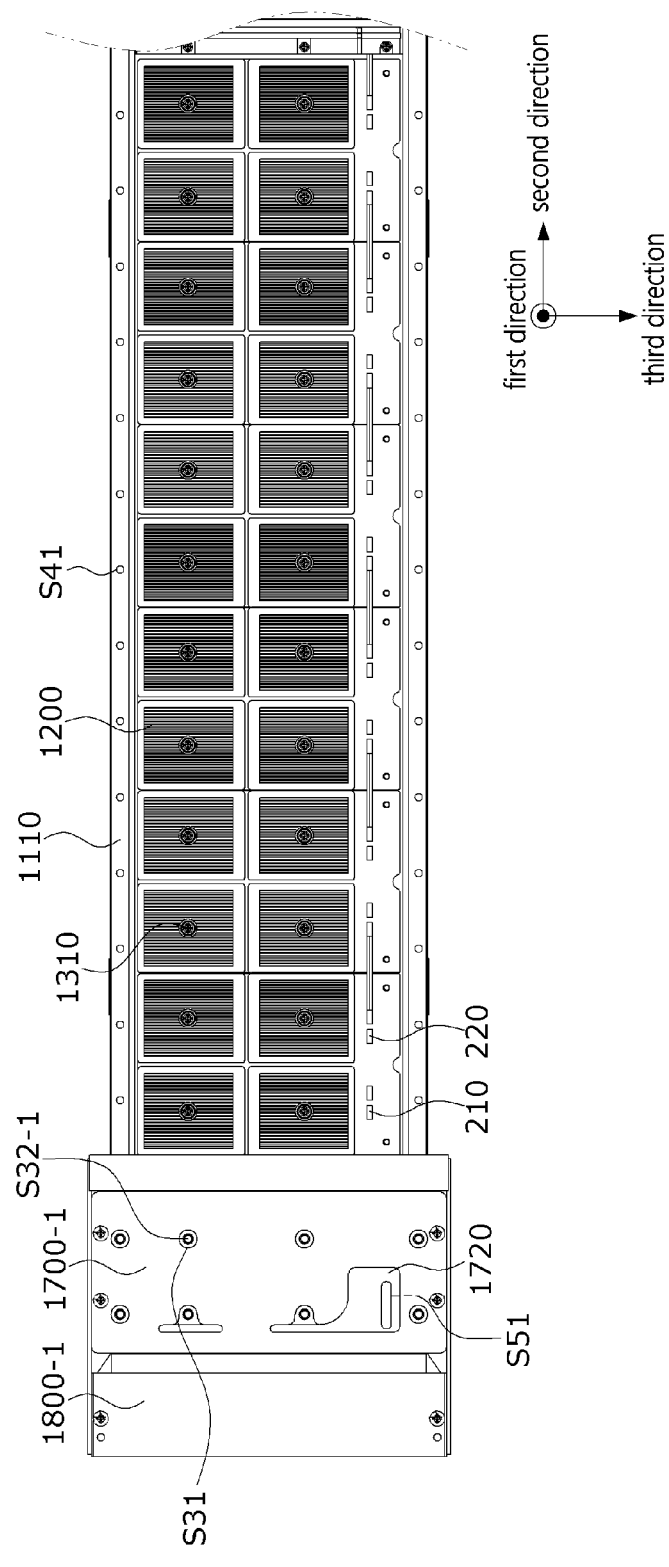
FIG. 6 is a top view of a plurality of thermoelectric modules and a guide member disposed on one surface of a fluid flow part included in the thermoelectric device according to one embodiment of the present invention.
Figure 7:
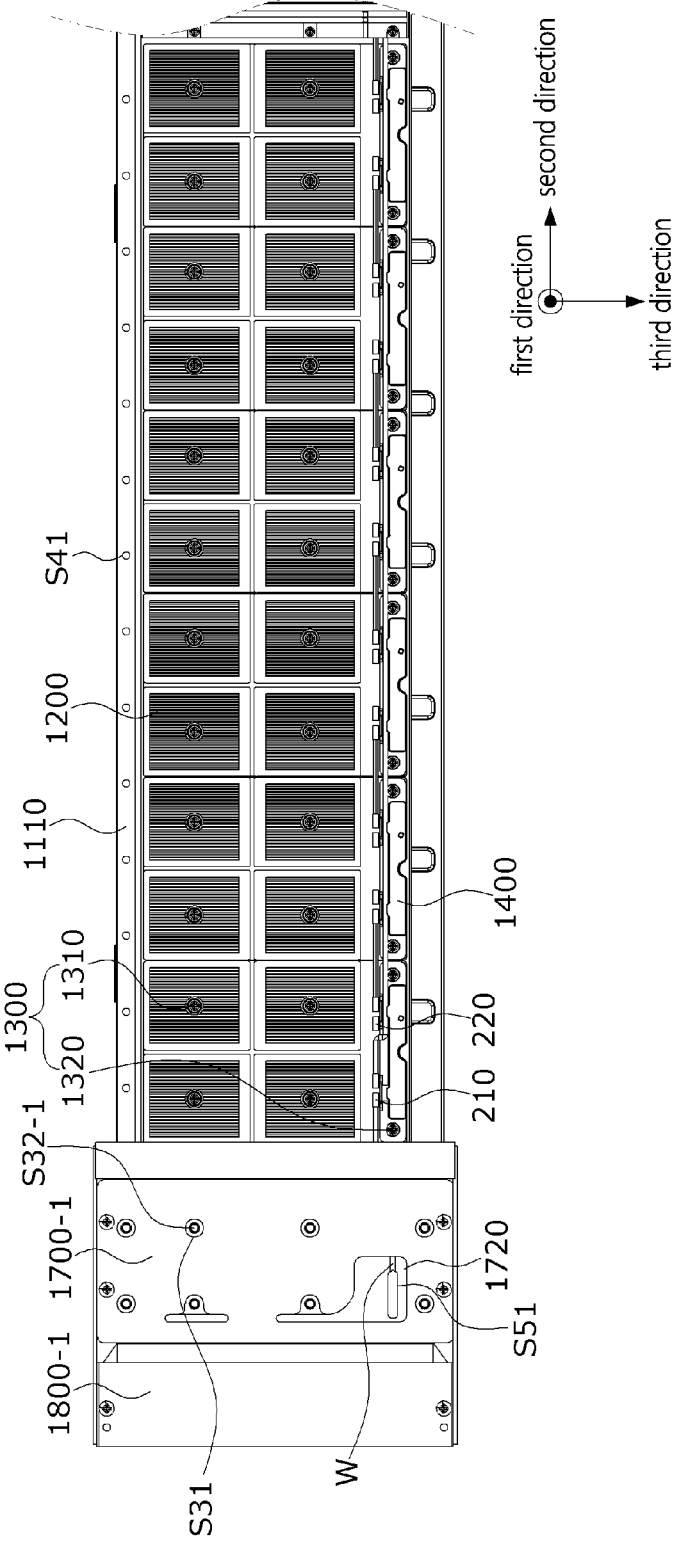
FIG. 7 is a top view of the plurality of thermoelectric modules, the guide member, and a plurality of support members disposed on the one surface of the fluid flow part included in the thermoelectric device according to one embodiment of the present invention.
Figure 8:
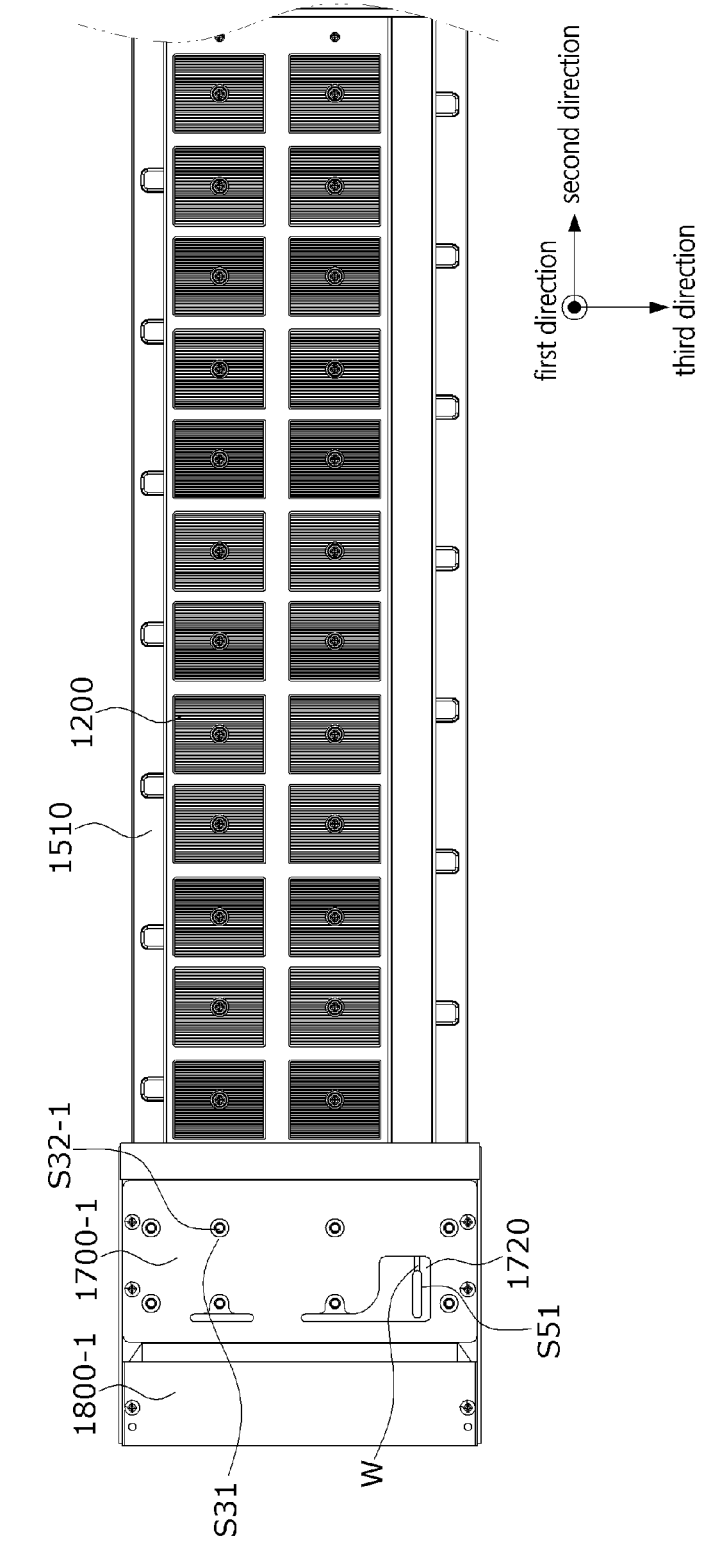
FIG. 8 is a top view of the plurality of thermoelectric modules, the guide member, the plurality of support members, and a shield member disposed on the one surface of the fluid flow part included in the thermoelectric device according to one embodiment of the present invention.
Figure 9:
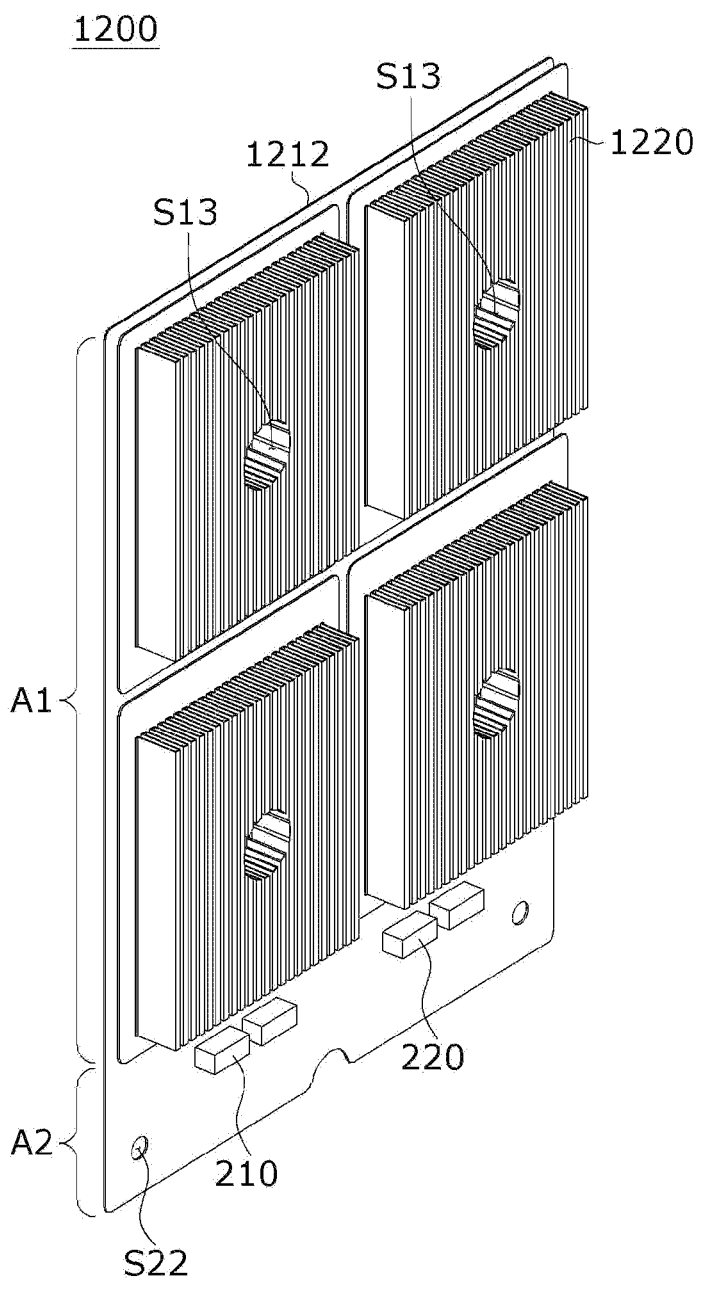
FIG. 9 is a perspective view of the thermoelectric module included in the thermoelectric device according to one embodiment of the present invention.
Figure 10:
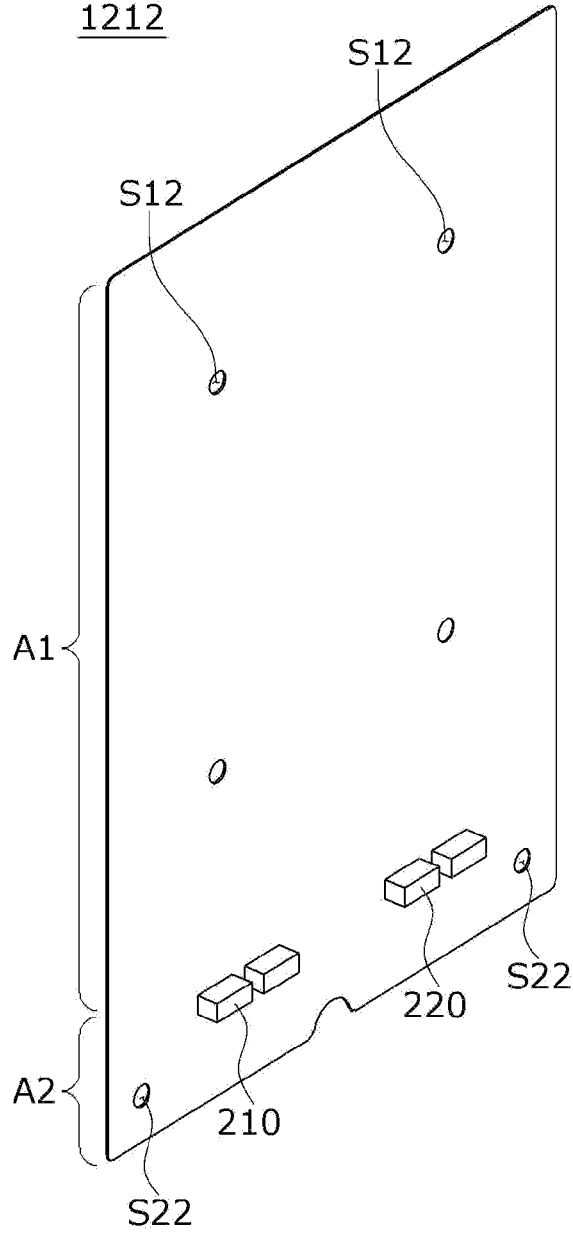
FIG. 10 is a top view of a first substrate of the thermoelectric module included in the thermoelectric device according to one embodiment of the present invention.
Figure 11:
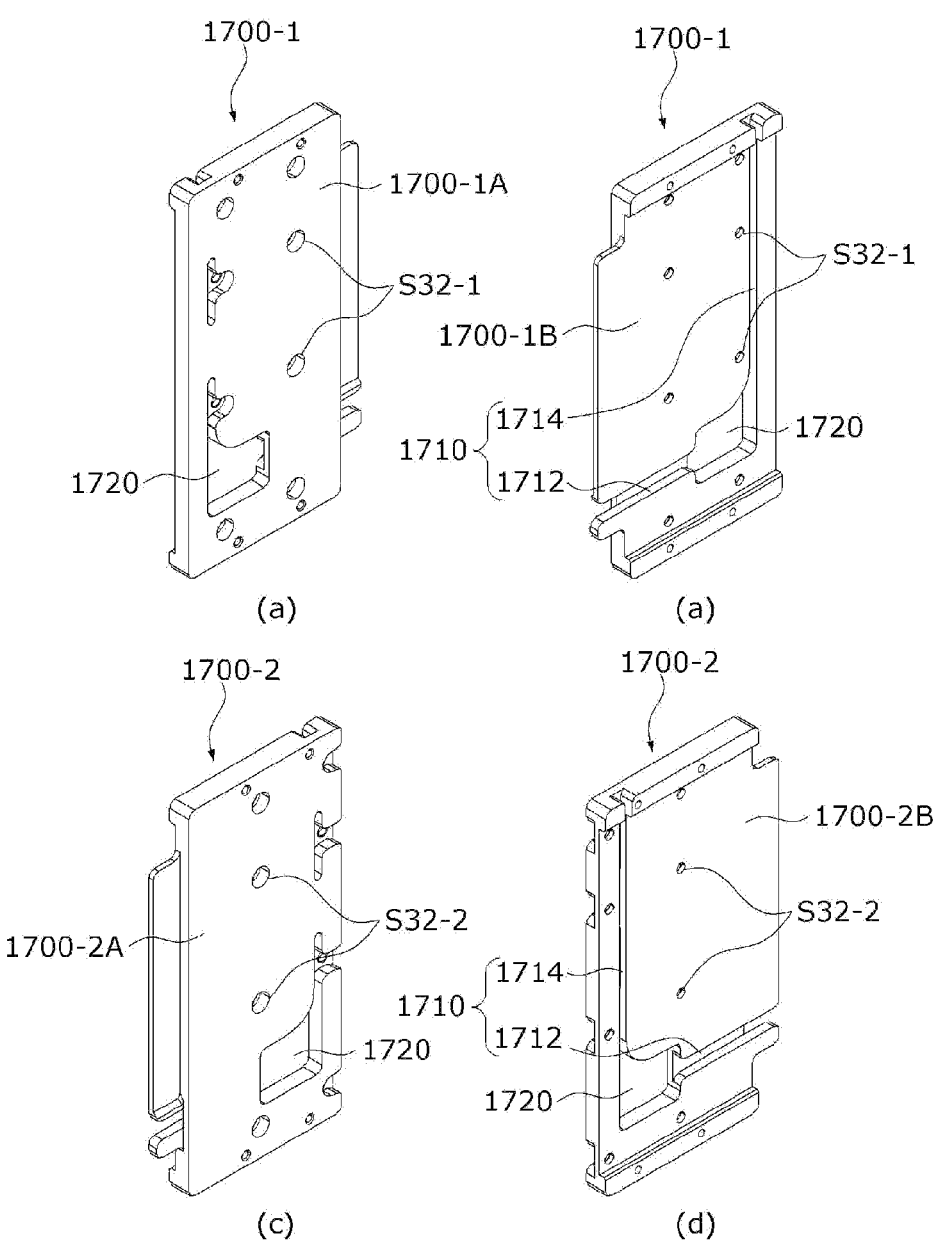
FIG. 11(*a*) to (*d*) are perspective views of the guide member according to one embodiment of the present invention.
Figure 12:
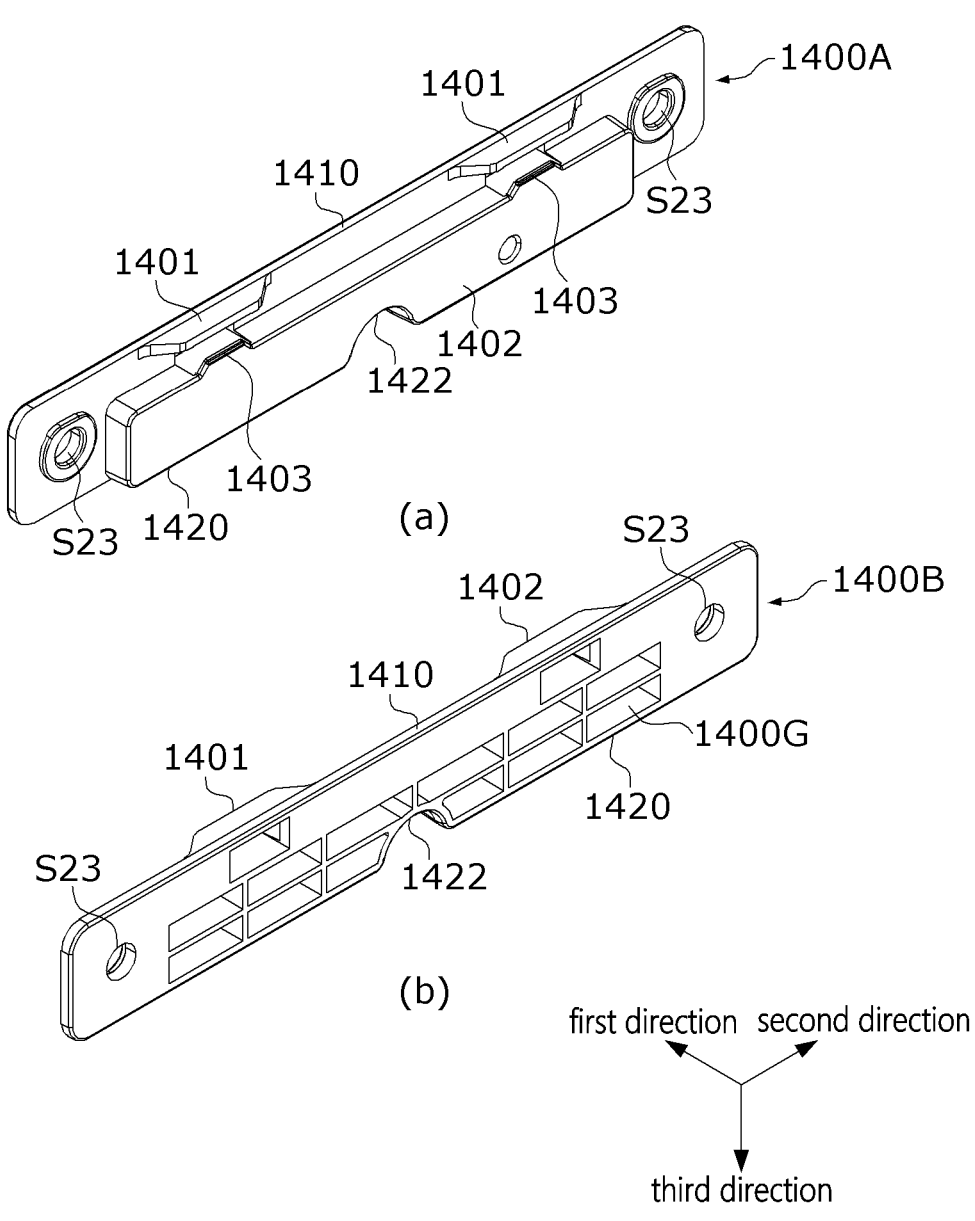
FIGS. 12(*a*) and (*b*) are perspective views of the support member according to one embodiment of the present invention.
Figure 13:
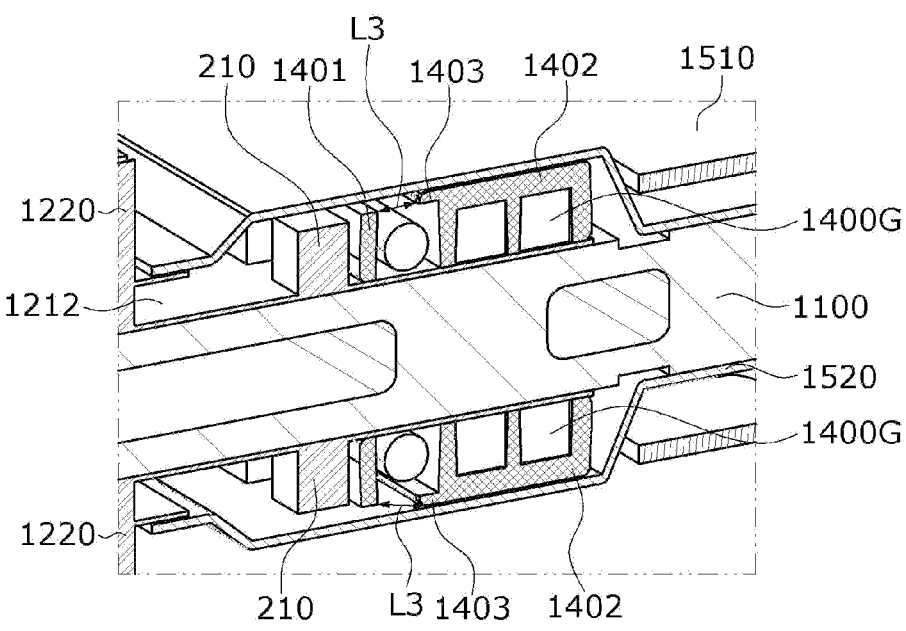
FIG. 13 is a cross-sectional view illustrating an arrangement relationship between the support member and a connector part in the thermoelectric device according to one embodiment of the present invention.
Figure 14:
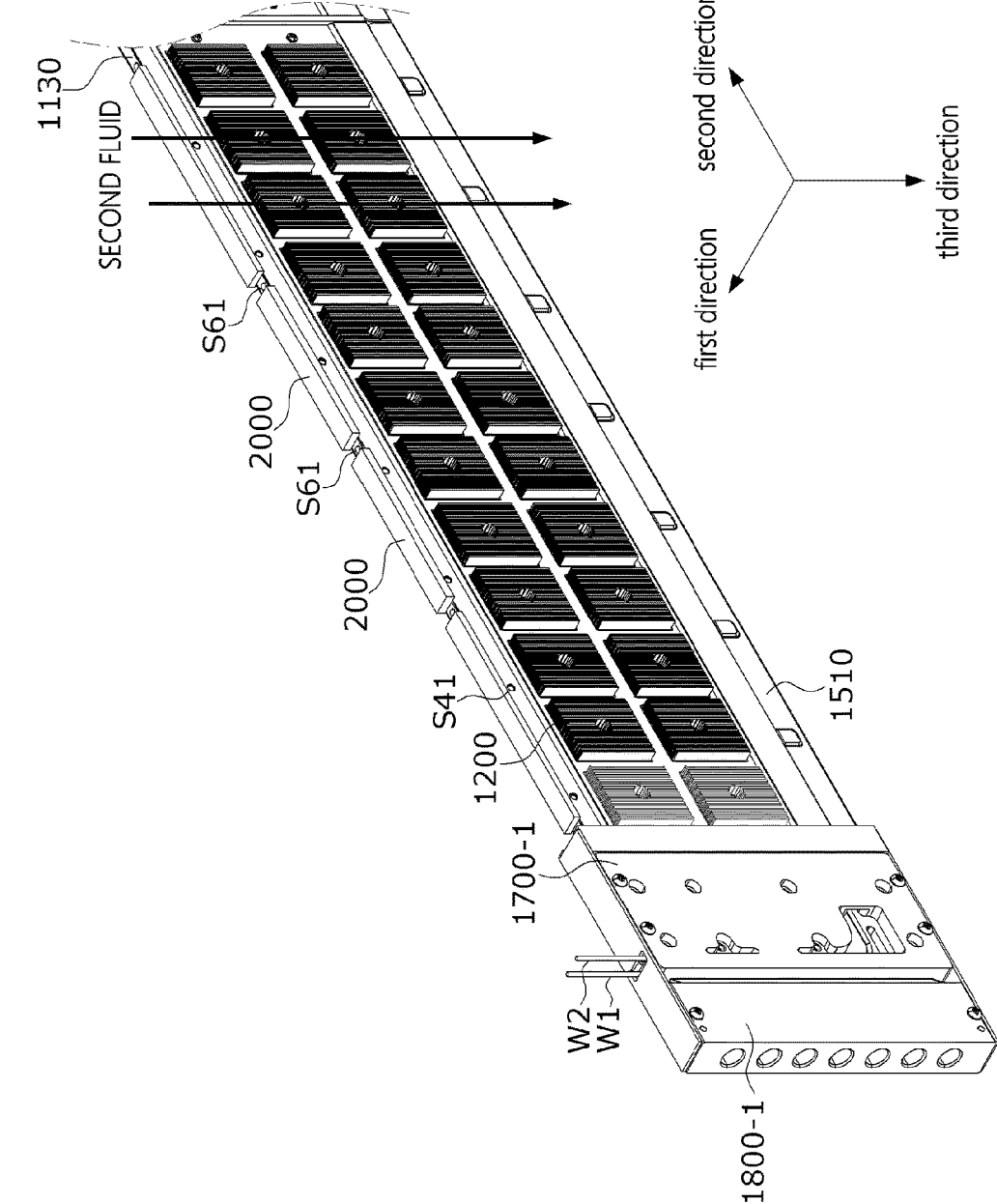
FIG. 14 is a perspective view of a state in which a third shield member is removed from the thermoelectric device according to one embodiment of the present invention.

FIG. 5 is a perspective view of one surface of a fluid flow part included in the thermoelectric device according to one embodiment of the present invention, FIG. 6 is a top view of a plurality of thermoelectric modules and a guide member disposed on the one surface of the fluid flow part included in the thermoelectric device according to one embodiment of the present invention, FIG. 7 is a top view of the plurality of thermoelectric modules, the guide member, and a plurality of support members disposed on the one surface of the fluid flow part included in the thermoelectric device according to one embodiment of the present invention, FIG. 8 is a top view of the plurality of thermoelectric modules, the guide member, the plurality of support members, and a shield member disposed on the one surface of the fluid flow part included in the thermoelectric device according to one embodiment of the present invention, FIG. 9 is a perspective view of the thermoelectric module included in the thermoelectric device according to one embodiment of the present invention, FIG. 10 is a top view of a first substrate of the thermoelectric module included in the thermoelectric device according to one embodiment of the present invention, FIG. 11 is a perspective view of the guide member according to one embodiment of the present invention, FIG. 12 is a perspective view of the support member according to one embodiment of the present invention, FIG. 13 is a cross-sectional view illustrating an arrangement relationship between the support member and a connector part in the thermoelectric device according to one embodiment of the present invention, and FIG. 14 is a perspective view of a state in which a third shield member is removed from the thermoelectric device according to one embodiment of the present invention.

Referring to FIGS. 5 to 10, the thermoelectric module 1200 and a guide member 1700-1 are disposed on the first surface 1100 of the fluid flow part 1100. Hereinafter, for convenience of description, only the thermoelectric module 1200 and the guide member 1700-1 disposed on the first surface 1110 of the fluid flow part 1100 are described, but the present invention is not limited thereto, and the same structure may be applied to the second surface 1120, which is a surface opposite to the first surface 1110. With regard to the fluid flow part 1100 and the thermoelectric module 1200, overlapping descriptions of the same contents as those described with reference to FIGS. 1 to 4 will be omitted.

According to the embodiment of the present invention, a first substrate 1212 of the thermoelectric module 1200 is disposed on the first surface 1110 of the fluid flow part 1100. In this case, the first substrate 1212 may be disposed in direct contact with the first surface 1110 of the fluid flow part 1100 or disposed in indirect contact therewith through the TIM or the like. The first substrate 1212 may be the first substrate 110 described with reference to FIGS. 1 to 4. Therefore, with regard to the first substrate 1212, overlapping descriptions of the same contents as the first substrate 110 described with reference to FIGS. 1 to 4 will be omitted.

As illustrated in FIGS. 9 and 10, the first substrate 1212 of the thermoelectric module 1200 may include a first area A1 and a second area A2. In this case, a plurality of first electrodes, a plurality of thermoelectric legs, a plurality of second electrodes, a second substrate, and a heat sink 1220 may be disposed in the first area A1, and connector parts 210 and 220 connected to the first electrode may be disposed in the second area A2, which is one side of the first area A1. Here, the plurality of first electrodes, the plurality of thermoelectric legs, the plurality of second electrodes, and the second substrate may be the plurality of first electrodes 120, the plurality of thermoelectric legs 130 and 140, the plurality of second electrodes 150, and the second substrate 160 described with reference to FIGS. 1 to 4. In FIG. 9, an example in which the second substrate and the heat sink 1220 are divided into four portions is illustrated, but the present invention is not limited thereto. One second substrate and one heat sink 1220 may be disposed for one first substrate, or the second substrate and the heat sink 1220 may be divided into two or more for one first substrate.

According to the embodiment of the present invention, as illustrated in FIGS. 6 to 8, the fluid flow part 1100 and the thermoelectric module 1200 may be coupled by a coupling member 1300. To this end, a first groove S11 formed to overlap the first substrate 1212 of the thermoelectric module 1200 in the first direction, that is, a direction from the first surface 1110 to the second surface 1120 may be formed in the first surface 1110 of the fluid flow part 1100 (see FIG. 5), and a through hole S12 corresponding to the first groove S11 may be formed in the first area A1 of the first substrate 1212 of the thermoelectric module 1200. In addition, a through hole S13 corresponding to the first groove S11 and the through hole S12 may also be formed in the second substrate (not illustrated) and the heat sink 1220 of the thermoelectric module 1200. Therefore, as illustrated in FIGS. 6 to 8, a first coupling member 1310 is coupled to the first groove S11, the through hole S12, and the through hole S13, and thus the fluid flow part 1100 and the thermoelectric module 1200 may be coupled.

Meanwhile, according to the embodiment of the present invention, a second groove S21 may be further formed in the first surface 1110 of the fluid flow part 1100 (see FIG. 5), and a through hole S22 corresponding to the second groove S21 may be further formed in the second area A2 of the first substrate 1212 of the thermoelectric module 1200. In addition, a support member 1400 may be further disposed in the second area A2 of the first substrate 1212, and as illustrated in FIG. 7, the support member 1400 may be connected to the second groove S21 and the through hole S22 through a second coupling member 1320, and thus the fluid flow part 1100, the thermoelectric module 1200, and the support member 1400 may be fixed.

Therefore, since not only the first area A1 but also the second area A2 of the first substrate 1212 of the thermoelectric module 1200 may be coupled to the fluid flow part 1100, the entirety of the first substrate 1212 of the thermoelectric module 1200 may have uniform bonding strength with the fluid flow part 1100, and heat may be uniformly distributed to the entirety of the first substrate 1212. In particular, as illustrated in FIG. 7, when the first substrate 1212 of the thermoelectric module 1200 and the fluid flow part 1100 are coupled using the support member 1400, it is possible to increase a fastening torque of the second coupling member 1320 due to the application of the support member 1400. Therefore, since there is a low possibility that the second coupling member 1320 becomes loose even under a vibration condition, the thermoelectric module 1200 may be more firmly attached to the fluid flow part 1100.

Meanwhile, referring to FIG. 5, the fluid flow part 1100 may have a fluid inlet 1152 of the fluid flow part 1100 disposed in one side surface 1150 between the first surface 1110 and the second surface 1120 and a fluid outlet of the fluid flow part 1100 disposed in the other side surface between the first surface 1110 and the second surface 1120.

In addition, referring to FIGS. 5 to 8, according to the embodiment of the present invention, holes S31 and S41 may be formed in the first surface 1110 of the fluid flow part 1100 so as not to overlap the thermoelectric module 1200. The holes S31 and S41 may be formed to pass through the fluid flow part 1100 from the first surface 1110 to the second surface 1120 of the fluid flow part 1100. For example, the hole S31 may be a hole through which the guide member 1700-1 is fastened, and the hole S41 may be a hole through which the shield member 1500 is fastened. According to the embodiment of the present invention, the TIM may be disposed between the fluid flow part 1100 and the thermoelectric module 1200 in order to maximize the thermal transfer performance between the fluid flow part 1100 and the thermoelectric module 1200. In contrast, the guide member 1700-1 or the shield member 1500 may be disposed on the fluid flow part 1100 without the TIM and then fastened using the coupling member. Therefore, the holes S31 and S41 through which the guide member 1700-1 or the shield member 1500 is fastened may be formed to pass through the first surface 1110 and the second surface 1120 of the fluid flow part 1100.

According to the embodiment of the present invention, a hole S51 may be further formed in the first surface 1110 of the fluid flow part 1100 so as not to overlap the thermoelectric module 1200. The hole S51 may be formed to pass through the fluid flow part 1100 from the first surface 1110 to the second surface 1120 of the fluid flow part 1100 and may be a hole through which the wire connected to the thermoelectric module 1200 passes. To this end, the hole S51 may have a greater area than the other holes S31 and S41 have, and the hole S51 may be disposed in a range parallel to the second area A2 of the second substrate 1212 of the thermoelectric module 1200. Therefore, the wires connected to the connector parts 210 and 220 and supported by the support member 1400 may be disposed to extend to the hole S51, and the wire electrically connected to the thermoelectric module 1200 may be electrically connected to the thermoelectric module 1200 of the second surface 1120 by passing through the hole S51.

According to the embodiment of the present invention, the hole S51 may be symmetrically disposed on the one side surface 1150 side and the other side surface side of the fluid flow part 1100, and a wire W may pass through the hole S51 at the one side surface 1150 side and the hole S51 at the other side surface side.

Meanwhile, referring to FIGS. 1, 2, and 6 to 9, the thermoelectric device 1000 includes the fluid flow part 1100 and the thermoelectric module 1200 disposed on the surface of the fluid flow part 1100. The thermoelectric module 1200 may include a thermoelectric element 1210 and a heat sink 1220 disposed on the thermoelectric element 1210. According to the embodiment of the present invention, the guide member 1700 may be disposed on the side surfaces of the plurality of thermoelectric modules 1200. When a direction in which the plurality of thermoelectric modules 1200 are disposed is referred to as a second direction, the guide member 1700 may be disposed in the second direction with respect to the plurality of thermoelectric modules 1200.

For example, a pair of guide members 1700-1 and 1700-2 may be disposed to face each other at one side of each of the first surface 1110 and the second surface 1120 of the fluid flow part 1100. In addition, the pair of guide members 1700-1 and 1700-2 may also be disposed to face each other at the other sides of the first surface 1110 and the second surface 1120 of the fluid flow part 1100.

For example, the first fluid may flow into the one side of each of the first surface 1110 and the second surface 1120 of the fluid flow part 1100, and the first fluid may be discharged from the other sides of the first surface 1110 and the second surface 1120 of the fluid flow part 1100.

When the first guide member 1700-1 is disposed on the side surface of the thermoelectric module 1200 at the one side of the first surface 1110 of the fluid flow part 1100, the second guide member 1700-2 may be disposed to face the first guide member 1700-1 on the side surface of the thermoelectric module 1200 with the fluid flow part 1100 interposed therebetween at the one side of the second surface 1120 of the fluid flow part 1100. Likewise, when the second guide member 1700-2 is disposed on the side surface of the thermoelectric module 1200 at the other side of the first surface 1110 of the fluid flow part 1100, the first guide member 1700-1 may be disposed to face the second guide member 1700-2 on the side surface of the thermoelectric module 1200 with the fluid flow part 1100 interposed therebetween at the other side of the second surface 1120 of the fluid flow part 1100.

FIG. 11A illustrates a first surface of the first guide member, FIG. 13B illustrates a second surface of the first guide member, FIG. 13C illustrates a first surface of the second guide member, and FIG. 13D illustrates a second surface of the second guide member. Here, second surfaces 1700-1B and 1700-2B of the first guide member 1700-1 and the second guide member 1700-2 are surfaces disposed to face the fluid flow part 1100, and first surfaces 1700-1A and

1700-2A of the first guide member 1700-1 and the second guide member 1700-2 are surfaces opposite to the first guide member 1700-1 and the second guide member 1700-2.

According to the embodiment of the present invention, the guide member 1700 is disposed on the side surface of the thermoelectric module 1200 to reduce an empty space and guide the wire connected to the thermoelectric module 1200. Here, the guide member 1700 may be a structure that does not function as the thermoelectric element. Therefore, in the specification, the guide member may be referred to as a dummy module, a dummy member, or a guide module. Therefore, it is possible to minimize the empty space in the side surface of the thermoelectric module 1200 on the fluid flow part 1100, thereby reducing the possibility of moisture or the second fluid flowing into the empty space.

According to the embodiment of the present invention, a groove 1710 may be formed in the second surfaces 1700-1B and 1700-2B of the guide members 1700-1 and 1700-2, and the wires connected to the connector parts 210 and 220 may be guided along the groove 1710. To this end, the groove 1710 may include a first groove 1712 extending in the second direction and a second groove 1714 extending in the third direction to be parallel to the connector parts 210 and 220, and the wire may be drawn out to the outside along the first groove 1712 and the second groove 1714. As described above, when the groove 1710 is formed in the second surfaces 1700-1B and 1700-2B of the guide members 1700-1 and 1700-2, it is possible to minimize the exposure of the wire to high temperatures and minimize the possibility of the wire separated from the guide member 1700 in a frequent vibration environment.

Meanwhile, the wire connected to the thermoelectric module 1200 may extend in the second direction along the first groove 1712 and extend in the third direction along the second groove 1714. Therefore, the wire connected to the thermoelectric module 1200 may be bent between the first groove 1712 and the second groove 1714. In order to accommodate a bending area of the wire, a through hole 1720 may be formed between the first groove 1712 and the second groove 1714 of the guide members 1700-1 and 1700-2.

According to the embodiment of the present invention, as illustrated in FIG. 5, the hole S51 passing through the fluid flow part 1100 from the first surface 1110 to the second surface 1120 of the fluid flow part 1100 may be formed in the fluid flow part 1100. The hole S51 does not overlap the thermoelectric module 1200 and may be a hole through which the wire connected to the thermoelectric module 1200 passes. The thermoelectric module 1200 disposed on the first surface 1110 of the fluid flow part 1100 and the thermoelectric module 1200 disposed on the second surface 1120 of the fluid flow part 1100 may be electrically connected through the hole S51.

In this case, the hole S51 of the fluid flow part 1100 may be formed to overlap the through hole 1720 of each of the guide members 1700-1 and 1700-2 in the first direction, and areas of the through hole 1720 of each of the guide members 1700-1 and 1700-2 may be greater than the area of the hole S51 of the fluid flow part 1100. Therefore, it is possible to resolve spatial limits when the wires are bent in the through hole 1720 of each of the guide members 1700-1 and 1700-2 or pass through the hole S51. According to one embodiment, the wire W may pass through the hole S51 at the one side of the fluid flow part 1100 and may be drawn out to the outside through the guide member at the other side thereof. Alternatively, the wire W may pass through the hole S51 at the other side of the fluid flow part 1100 and may be drawn out to the outside through the guide member at the one side thereof. When the hole S51 of the fluid flow part 1100 is formed to overlap the through hole 1720 of each of the guide member 1700-1 and 1700-2 in the first direction, it is possible to increase a degree of freedom in design for connection and drawn-out directions of the wire W, and since two types of guide members are disposed at four regions, it is possible to facilitate the manufacture of the guide member.

Meanwhile, according to the embodiment of the present invention, each of the guide members 1700-1 and 1700-2 may be fixed to the fluid flow part 1100 using a third coupling member. To this end, a plurality of holes S31 may be formed in the fluid flow part 1100 to pass through the fluid flow part 1100 from the first surface 1110 to the second surface 1120 of the fluid flow part 1100, holes S32-1 corresponding to some S31-1 of the plurality of holes S31 may be formed in the first guide member 1700-1, and the third coupling member may pass through the holes S32-1 and the holes S31 and couple the first guide member 1700-1 to the fluid flow part 1100. Likewise, the holes S31 may be formed in the fluid flow part 1100 to pass through the fluid flow part 1100 from the first surface 1110 to the second surface 1120 of the fluid flow part 1100, holes S32-2 corresponding to the other holes S31-2 of the holes S31 may be formed in the second guide member 1700-2, and the third coupling member may pass through the holes S32-2 and the holes S31-2 and couple the second guide member 1700-2 to the fluid flow part 1100. In order to couple the first guide member 1700-1 and the second guide member 1700-2 on both surfaces of the fluid flow part 1100, some S31-1 of the holes formed in the fluid flow part 1100 and the other holes S31-2 of the holes may not overlap each other in the first direction. In addition, since the holes S32-1 of the first guide member 1700-1 should correspond to some S31-1 of the holes of the fluid flow part 1100 and the holes S32-2 of the second guide member 1700-2 should correspond to the other holes S31-2 of the holes of the fluid flow part 1100, the holes S32-1 of the first guide member 1700-1 and the holes S32-2 of the second guide member 1700-2 may be formed at different positions.

Meanwhile, referring to FIG. 7, the support member 1400 may be disposed adjacent to the connector parts 210 and 220 on the first substrate 1212 of the thermoelectric module 1200, and the wires W connected to the connector parts 210 and 220 may extend to the guide member 1700-1 in the second direction through the support member 1400. Therefore, the support member 1400 may uniformly maintain the bonding strength between the thermoelectric module 1200 and the fluid flow part 1100 and protect the wires connected to the connector parts 210 and 220.

Meanwhile, FIG. 12A illustrates a first surface 1400A of the support member 1400 according to one embodiment of the present invention, and FIG. 12B illustrates a second surface 1400B of the support member 1400 according to one embodiment of the present invention. The second surface 1400B of the support member 1400 may be a surface facing the first substrate 1212 of the thermoelectric module 1200, and the first surface 1400A of the support member 1400 may be a surface opposite to the second surface 1400B of the support member 1400.

Referring to FIGS. 6, 9, 10, 12A, and 12B, a plurality of through holes S23 may be formed at both sides of the support member 1400, and the second coupling member 1320 may be coupled to the plurality of through holes S23, the through holes S22 of the first substrate 1212 formed to correspond to the plurality of through holes S23, and the grooves S12 formed in the fluid flow part 1100 to correspond to the plurality of through holes S23. Therefore, it is possible to uniformly support both sides of the second area A2 of the first substrate 1212 in a balanced manner and prevent the thermal deformation of the first substrate 1212.

Here, the support member 1400 may include an insulating material, for example, a plastic material. Therefore, since the support member 1400 may insulate the first substrate 1212 and the second coupling member 1320 containing metal, it is possible to enhance the withstand voltage performance of the thermoelectric module 1200.

In addition, when the support member 1400 includes a plastic material, the support member 1400 may be easily molded into various sizes and shapes. More specifically, the support member 1400 may be a plastic material applicable at high temperatures, such as polyphenylene sulfide (PPS). Therefore, it is possible to prevent a problem of the deformation of the shape of the support member 1400 by the high-temperature second fluid.

Meanwhile, the support member 1400 includes a first side surface 1410 closest to one side of the thermoelectric element 1210 and a second side surface 1420 facing the first side surface 1410. The second side surface 1420 of the support member 1400 may be disposed along an edge of the first substrate 1212. Here, the edge of the first substrate 1212 may be disposed in the second area A2 among four edges of the first substrate 1212 and may be an edge in a direction parallel to a direction in which the plurality of connector parts 210 and 220 are disposed. As described above, when the second side surface 1420 of the support member 1400 is disposed along the edge of the first substrate 1212, the support member 1400 may press the edge of the first substrate 1212, thereby preventing a problem of the edge of the thermoelectric module 1200 lifted from the fluid flow part 1100. In this case, a groove 1422 concave toward the first side surface 1410 may be formed in the second side surface 1420 of the support member 1400. Therefore, since thermal stress is applied to both side surfaces of the support member 1400 in a balanced manner, it is possible to prevent the distortion of the support member 1400 due to imbalance in thermal stress.

More specifically, referring to FIGS. 12A and 12B and 13, the support member 1400 may include a first protruding surface 1401 protruding in the first direction and disposed to extend in the second direction, and a second protruding surface 1402 spaced apart from the first protruding surface 1401 in a direction away from the connector parts 210 and 220, protruding in the first direction, and disposed to extend in the second direction. According to the embodiment of the present invention, the wires connected to the connector parts 210 and 220 may extend toward the guide member 1700-1 between the first protruding surface 1401 and the second protruding surface 1402.

In this case, at least one of the first protruding surface 1401 and the second protruding surface 1402 may include a bending area 1403 bent in a direction parallel to the first substrate 1212. Therefore, a shortest distance L3 between the first protruding surface 1401 and the second protruding surface 1403 may be smaller than a diameter of the wire. Therefore, it is possible to minimize the possibility of the wire 00 separated from the support member 1400 as long as a physical external force is not applied even in a frequent vibration environment.

According to the embodiment of the present invention, as illustrated in FIG. 12B, a plurality of grooves 1400G may be disposed in an area corresponding to the second protruding surface 1402 on the second surface 1400B of the support member 1400. Therefore, it is possible to uniformly press the area of the first substrate 1212 corresponding to the second protruding surface 1402 while reducing the overall material and weight of the support member 1400.

As described above, a plurality of thermoelectric modules 1200 are disposed on the fluid flow part 1100, the support member 1400 is disposed on the side surfaces of the connector parts 210 and 220, the plurality of thermoelectric modules, the support member 1400, and the fluid flow part 1100 are coupled using the coupling members, and the plurality of thermoelectric modules 1200 are connected with the wires. Thereafter, the shield member 1500 may be further disposed to prevent moisture or contaminants from flowing into the plurality of thermoelectric modules 1200. As described above, the shield member 1500 includes the first shield member 1510 disposed on the first surface 1110 of the fluid flow part 1100, the second shield member 1520 disposed on the second surface 1120 of the fluid flow part 1100, the third shield member 1530 disposed on the third surface 1130 of the fluid flow part 1100, and the fourth shield member 1540 disposed on the fourth surface 1140 of the fluid flow part 1100.

Referring to FIG. 13, the connector parts 210 and 220 and the support member 1400 may be disposed adjacent to each other on the first substrate 1212 of the thermoelectric module 1200, and the first shield member 1510 may be disposed to cover the connector parts 00 and the support member 1400. In this case, a height of the support member 1400 may be greater than a height of the connector parts 210 and 220 with respect to the first substrate 1212 of the thermoelectric module 1200. Therefore, since the first shield member 1510 made of a metal material may be in contact with an upper surface of the support member 1400 but spaced apart from the connector parts 210 and 220, it is possible to enhance the withstand voltage characteristics of the thermoelectric element 1210 and prevent heat generated from the connector parts 210 and 220 from being conducted through the first shield member 1510.

Meanwhile, according to the embodiment of the present invention, an insulating member may be disposed on the surface of the fluid flow part 1100. Referring to FIG. 14, since the second fluid may flow in a direction from the third surface 1130 of the fluid flow part 1100 to the fourth surface 1140, an insulating member 2000 may be further disposed between the third surface 1130 of the fluid flow part 1100 and the third shield member 1530. According to the embodiment of the present invention, a plurality of insulating members 2000 may be disposed to be spaced apart from each other between the third surface 1130 of the fluid flow part 1100 and the third shield member 1530. In addition, a plurality of holes S61 may be disposed in the third surface 1130 of the fluid flow part 1100, and the plurality of holes S61 may be disposed between the plurality of insulating members 2000.

Therefore, the third shield member 1530 and the third surface 1130 of the fluid flow part 1100 may be fixed by the coupling members disposed in the third shield member 1530 and the plurality of holes S61 with the plurality of insulating members 2000 interposed therebetween. Therefore, it is possible to minimize the number of third shield members 1530 and simultaneously ensure a fastening strength and insulation between the third shield member 1530 and the fluid flow part 1100.

Meanwhile, according to the embodiment of the present invention, the plurality of holes S61 disposed in the third surface 1130 of the fluid flow part 1100 may be disposed in the second direction to be misaligned with the plurality of holes S41 disposed to couple the first shield member 1510 on the first surface 1110 of the fluid flow part 1100. Therefore, since the coupling member passing through the holes S41 to couple the first shield member 1510 to the first surface of the fluid flow part 1100 and the coupling member passing through the holes S61 to couple the third shield member 1530 to the third surface of the fluid flow part 1100 do not overlap each other, fastening can be easy.

Throughout the specification, the thermoelectric elements 100 and 1210 are described as including the first substrate 110, the first electrode 120, the P-type thermoelectric leg 130, the N-type thermoelectric leg 140, the second electrode 150, and the second substrate 160, but the definition of the thermoelectric elements 100 and 1210 is not limited thereto, and the thermoelectric elements 100 and 1210 may include the first electrode 120, the P-type thermoelectric leg 130, the N-type thermoelectric leg 140, the second electrode 150, and the second substrate 160 and mean as being disposed on the first substrate 110.

The power generation system may generate power through heat sources generated from vessels, vehicles, power plants, geothermal heat, or the like and include a plurality of power generation devices arranged to efficiently converge the heat sources. In this case, in each power generation device, it is possible to improve the cooling performance of the low-temperature part of the thermoelectric element by improving the bonding strength between the thermoelectric module and the fluid flow part, thereby improving the efficiency and reliability of the power generation device and thus improving the fuel efficiency of the transportation such as vessels or vehicles. Therefore, in the shipping and transportation industry, it is possible to reduce transportation costs, create an eco-friendly industry environment, and reduce material costs and the like when applied to a manufacturing industry such as a steel mill.

Although the present invention has been described above with reference to exemplary embodiments, those skilled in the art will understand that the present invention may be modified and changed variously without departing from the spirit and scope of the present invention as described in the appended claims.

The invention claimed is:

1. A thermoelectric device comprising:
a fluid flow part including one surface and the other surface spaced apart from the one surface in a first direction;
a first thermoelectric element disposed on the one surface of the fluid flow part;
a second thermoelectric element disposed on the other surface of the fluid flow part,
a first guide member disposed on a side surface of the first thermoelectric element on the one surface of the fluid flow part; and
a second guide member disposed on a side surface of the second thermoelectric element on the other surface of the fluid flow part, wherein
a first through hole passing through the fluid flow part from the one surface to the other surface is disposed in the fluid flow part,
a wire electrically connected to the first thermoelectric element passes through the first through hole and is electrically connected to the second thermoelectric element,
a second through hole overlapping the first through hole in the first direction is disposed in the first guide member, a plurality of holes passing through the fluid flow part from the one surface to the other surface and not overlapping the first thermoelectric element and the second thermoelectric element in the first direction are disposed in the fluid flow part, at least one first coupling hole is disposed in the first guide member, at least one second coupling hole is disposed in the second guide member, the first guide member and the fluid flow part are fixed by coupling members disposed in the at least one first coupling hole and some of the plurality of holes, and the second guide member and the fluid flow part are fixed by coupling members disposed in the at least one second coupling hole and some of the other holes of the plurality of holes.

2. The thermoelectric device of claim 1, wherein an area of the second through hole is greater than an area of the first through hole.

3. The thermoelectric device of claim 1, wherein the wire connected to at least one of the first thermoelectric element and the second thermoelectric element is guided by at least one of the first guide member and the second guide member.

4. The thermoelectric device of claim 1, wherein the at least one first coupling hole and the at least one second coupling hole are disposed not to overlap each other in the first direction.

5. The thermoelectric device of claim 1, wherein a fluid inlet of the fluid flow part is disposed in one side surface between the one surface and the other surface, and a fluid outlet of the fluid flow part is disposed in an opposite side surface facing the one side surface between the one surface and the other surface, the fluid flow part includes a flow path extending in a second direction from the one side surface to the opposite side surface, and a plurality of insulating members spaced apart from each other in the second direction are disposed on an upper surface between the one surface and the other surface.

6. The thermoelectric device of claim 5, wherein the upper surface includes a plurality of holes disposed between the plurality of insulating members, a shield member is disposed on the plurality of insulating members, and the shield member and the upper surface are fixed by coupling members disposed in the shield member and the plurality of holes.

7. The thermoelectric device of claim 6, wherein the one surface further includes a plurality of holes disposed to be spaced apart from each other in the second direction between the first thermoelectric element and the upper surface, and the plurality of holes included in the upper surface and the plurality of holes included in the one surface are disposed in the second direction to be misaligned with each other.

8. The thermoelectric device of claim 5, wherein the first thermoelectric element includes a first substrate disposed on the one surface of the fluid flow part, a first electrode disposed on a first area of the first substrate, a semiconductor structure disposed on the first electrode, a second electrode disposed on the semiconductor structure, and a second substrate disposed on the second electrode, the thermoelectric device further comprises a connector part disposed on a second area adjacent to the first area of the first substrate and electrically connected to the first electrode, and a support member disposed adjacent to the connector part on the second area, and a height of the support member is greater than a height of the connector part with respect to the first substrate.

9. The thermoelectric device of claim 8, wherein the wire is connected to the connector part and extends to the first guide member in a second direction from the one side surface to the opposite side surface through the support member.

10. The thermoelectric device of claim 9, wherein the support member includes a first protruding surface protruding in a direction perpendicular to the first substrate and disposed to extend in the second direction, and a second protruding surface spaced apart from the first protruding surface in a direction away from the connector part, protruding in a direction perpendicular to the first substrate, and disposed to extend in the second direction, and at least one of the first protruding surface and the second protruding surface include a bending area bent in a direction parallel to the first substrate.

11. The thermoelectric device of claim 10, wherein a shortest distance between the first protruding surface and the second protruding surface is smaller than a diameter of the wire.

12. The thermoelectric device of claim 1, wherein a groove part is formed to guide the wire in the first guide member.

13. The thermoelectric device of claim 12, wherein the groove part includes a first groove extending along a second direction perpendicular to the first direction and a second groove extending along a third direction perpendicular to the first direction and the second direction.

* * * * *